(12) United States Patent
Kalam

(10) Patent No.: US 11,342,935 B2
(45) Date of Patent: *May 24, 2022

(54) CYCLIC REDUNDANCY CHECK (CRC) SYSTEM FOR DETECTING ERROR IN DATA COMMUNICATION

(71) Applicant: SAMSUNG ELECTRONICS CO., LTD., Suwon-si (KR)

(72) Inventor: Abdul Latheef Abdul Kalam, Bangalore (IN)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/022,991

(22) Filed: Sep. 16, 2020

(65) Prior Publication Data
US 2021/0006263 A1 Jan. 7, 2021

Related U.S. Application Data

(63) Continuation of application No. 16/116,585, filed on Aug. 29, 2018, now Pat. No. 10,790,852.

(30) Foreign Application Priority Data

Mar. 27, 2018 (IN) .............................. 201841011445

(51) Int. Cl.
*H03M 13/09* (2006.01)
*H03M 13/00* (2006.01)
(Continued)

(52) U.S. Cl.
CPC ..... *H03M 13/091* (2013.01); *H03M 13/6502* (2013.01); *H03M 13/6561* (2013.01); *H04L 1/0061* (2013.01)

(58) Field of Classification Search
None
See application file for complete search history.

(56) References Cited

U.S. PATENT DOCUMENTS 5,167,034 A * 11/1992 MacLean, Jr. ..... G11B 20/1833
714/52
6,357,032 B1 * 3/2002 Plotz ................... H03M 13/091
370/229
(Continued)

FOREIGN PATENT DOCUMENTS

KR 20110078164 A 7/2011
KR 20130068213 A 6/2013

OTHER PUBLICATIONS

Sheng-Ju, Implementation of Cyclic Redundancy Check in Data Communication, IEEE, Conference Paper, pp. 529-531 (Year: 2015).*

*Primary Examiner* — Cynthia Britt
*Assistant Examiner* — Dipakkumar B Gandhi
(74) *Attorney, Agent, or Firm* — Volentine, Whitt & Francos, PLLC

(57) ABSTRACT

A cyclic redundancy check (CRC) system includes an input unit, a plurality of CRC engines for 1 byte to n/2 byte, and an output unit. The input unit has a data de-multiplexer for receiving n byte data. The plurality of CRC engines for 1 byte to n/2 byte are connected to the data de-multiplexer for processing demultiplexed n byte data. The output unit has a data multiplexer for providing processed CRC output data. The plurality of CRC engines for 1 byte to n/2 byte are arranged in two columns. A first column includes one or more CRC engines for 1 byte to n/2 byte and a second column includes a CRC engine for n/2 byte.

20 Claims, 4 Drawing Sheets

(51) Int. Cl.
*H04L 1/00* (2006.01)
*H03M 13/53* (2006.01)

(56) References Cited

U.S. PATENT DOCUMENTS

| | | |
|---|---|---|
| 7,191,383 B2 | 3/2007 | Lin et al. |
| 7,243,289 B1 | 7/2007 | Madhusudhana et al. |
| 7,290,196 B1 | 10/2007 | Annayya et al. |
| 7,590,916 B2 | 9/2009 | Katashita et al. |
| 8,136,010 B2 | 3/2012 | Leonard et al. |
| 9,143,276 B2 | 9/2015 | Zhou et al. |
| 2001/0005385 A1* | 6/2001 | Ichiguchi ............... H04N 19/89 370/535 |
| 2006/0168496 A1 | 7/2006 | Steele et al. |
| 2007/0011561 A1* | 1/2007 | Ambilkar ............... H03M 13/09 714/758 |
| 2007/0016842 A1* | 1/2007 | Samuel ................. H03M 13/09 714/781 |
| 2009/0296921 A1 | 12/2009 | Jeanne et al. |
| 2010/0313104 A1 | 12/2010 | Bommena et al. |
| 2012/0324319 A1* | 12/2012 | Grinchuk ............ H03M 13/616 714/807 |
| 2015/0378826 A1 | 12/2015 | Zhang et al. |

\* cited by examiner

CYCLIC REDUNDANCY CHECK (CRC) SYSTEM FOR DETECTING ERROR IN DATA COMMUNICATION

CROSS-REFERENCE TO RELATED APPLICATIONS

This is a Continuation of U.S. application Ser. No. 16/116,585, filed Aug. 29, 2018 which claims priority under 35 U.S.C. § 119 to Indian Patent Application No. 201841011445 filed on Mar. 27, 2018, in the Indian Intellectual Property Office, the disclosure of which is incorporated by reference herein in its entirety.

FIELD

The disclosure relates to data communication, and more particularly relates to employing cyclic redundancy checks (CRCs) to detect an error in the data communication.

BACKGROUND

Reliable transmission of data typically involves computation of error detecting checks, such as cyclic redundancy checks (CRCs), to support a wide range of protocols and transmission mediums. For example, the Internet Small Computer Systems Interface (iSCSI) standard provides a mechanism for exchanging SCSI commands and data over Transmission Control Protocol/Internet Protocol (TCP/IP).

FIG. 1 is a schematic diagram illustrating a CRC engine system for n byte data, according to related art. According to FIG. 1, a CRC engine system for n bytes of data width for a single lane is shown where the CRC-number of the CRC engine=(number of data bytes "n")*(8 bits/byte). A similar set of CRC engines exists in each lane, which creates excessive resources when the number of lane increases. The CRC engine is enabled by providing a CRC select signal to the data de-multiplexer and the data multiplexer. Additionally, the CRC engine for higher numbers of bits, such 64 bits, consumes more resources compared to the CRC engine for lower bits, such as 32 bits. Generally, an on-chip CRC engine system that is implemented for high speed serial links protocols fails in timing. When a line rate or link speed increases in each generation of technology, meeting the timing on-chip, such as with a field-programmable gate array (FPGA), for CRC becomes increasingly difficult. Also when number of lanes increases, a resource count to implement CRC on-chip also increases and becomes a bottleneck in silicon area as well as closing timing.

FIG. 2 is a schematic diagram illustrating a CRC engine system for 8 byte data, or 64 bit data, according to related art. Consider the Ethernet CRC checksum calculation where an input data width is 64 bits. The CRC to be applied is 64 bits CRC. The data input and the CRC exclusive-or function is used to obtain a calculated CRC. The CRC engine is enabled by providing a CRC select signal to the data de-multiplexer and the data multiplexer. To achieve the final CRC output, the number of bytes in the last data input is used to run a corresponding CRC engine. For 1 byte to 8 bytes of valid data in a last data input, 8 CRC engines are required. Here the area utilization is more and meeting the timing in silicon, such as an FPGA, is difficult.

In view of the foregoing, there is a need for a CRC calculation for high speed serial communication protocol which reduces silicon resources, thus optimizing the area and timing.

SUMMARY OF THE INVENTION

Various embodiments herein describe a cyclic redundancy check (CRC) engine system for detecting an error in data communication.

According to one embodiment, a CRC engine system includes an input unit having a data demultiplexing module for receiving n byte data. A plurality of CRC engines for 1 byte to n/2 byte are connected to the data demultiplexing module for processing demultiplexed n byte data. An output unit has a data multiplexing module for providing a processed CRC output data. The plurality of CRC engines for 1 byte to n/2 byte are arranged in two columns A first column comprises one or more CRC engines for 1 byte to n/2 byte and a second column comprises a CRC engine for n/2 byte.

According to an embodiment, a method is disclosed for detecting an error in data communication by a cyclic redundancy check (CRC) unit. The method including: (1) receiving, by a data demultiplexing module, n byte data, (2) processing, by a plurality of CRC engines for 1 byte to n/2 byte, the demultiplexed n byte data, and (3) providing, by a data multiplexing module, the processed CRC output data. The plurality of CRC engines for 1 byte to n/2 byte are arranged in two columns, a first column having one or more CRC engines for 1 byte to n/2 byte and a second column having a CRC engine for n/2 byte.

According to an embodiment, a cyclic redundancy check (CRC) device includes a first CRC engine that generate a first partial CRC result for n≥1 bytes of data and a second CRC engine that generate a second partial CRC result for m≥n bytes of data. A multiplexer combines the first partial CRC result and the second partial CRC result to generate a first complete CRC result for m bytes of input data.

According to an embodiment, a cyclic redundancy check (CRC) method includes: (1) generating, with a first CRC engine, a first partial CRC result for n≥1 bytes of data, (2) generating, with a second CRC engine, a second partial CRC result for m≥n bytes of data, and (3) combining, with a multiplexer, the first partial CRC result and the second partial CRC result to generate a first complete CRC result for m bytes of input data.

BRIEF DESCRIPTION OF THE ACCOMPANYING DRAWINGS

Objects, features and advantages will occur to those skilled in the art from the following description of the preferred embodiment and the accompanying drawings in which.

DETAILED DESCRIPTION OF THE INVENTION

The disclosure describes a cyclic redundancy check (CRC) engine system for detecting error in data communication. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the disclosure. The following detailed description is, therefore, not to be taken in a limiting sense, and the scope of the disclosure is defined only by the appended claims.

Figure 1:
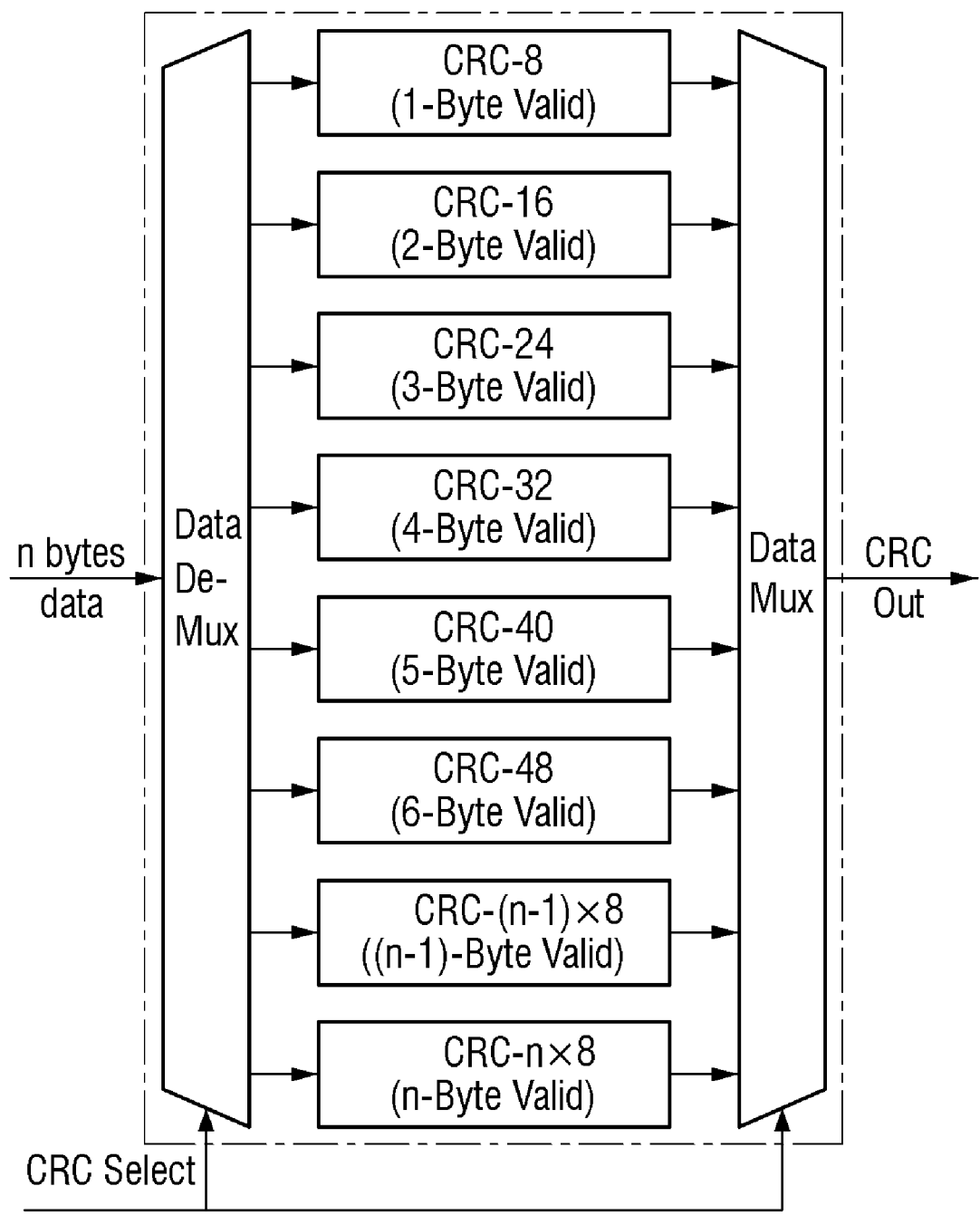
FIG. 1 is a schematic diagram illustrating a CRC engine system for n byte data, according to related art.
Figure 2:
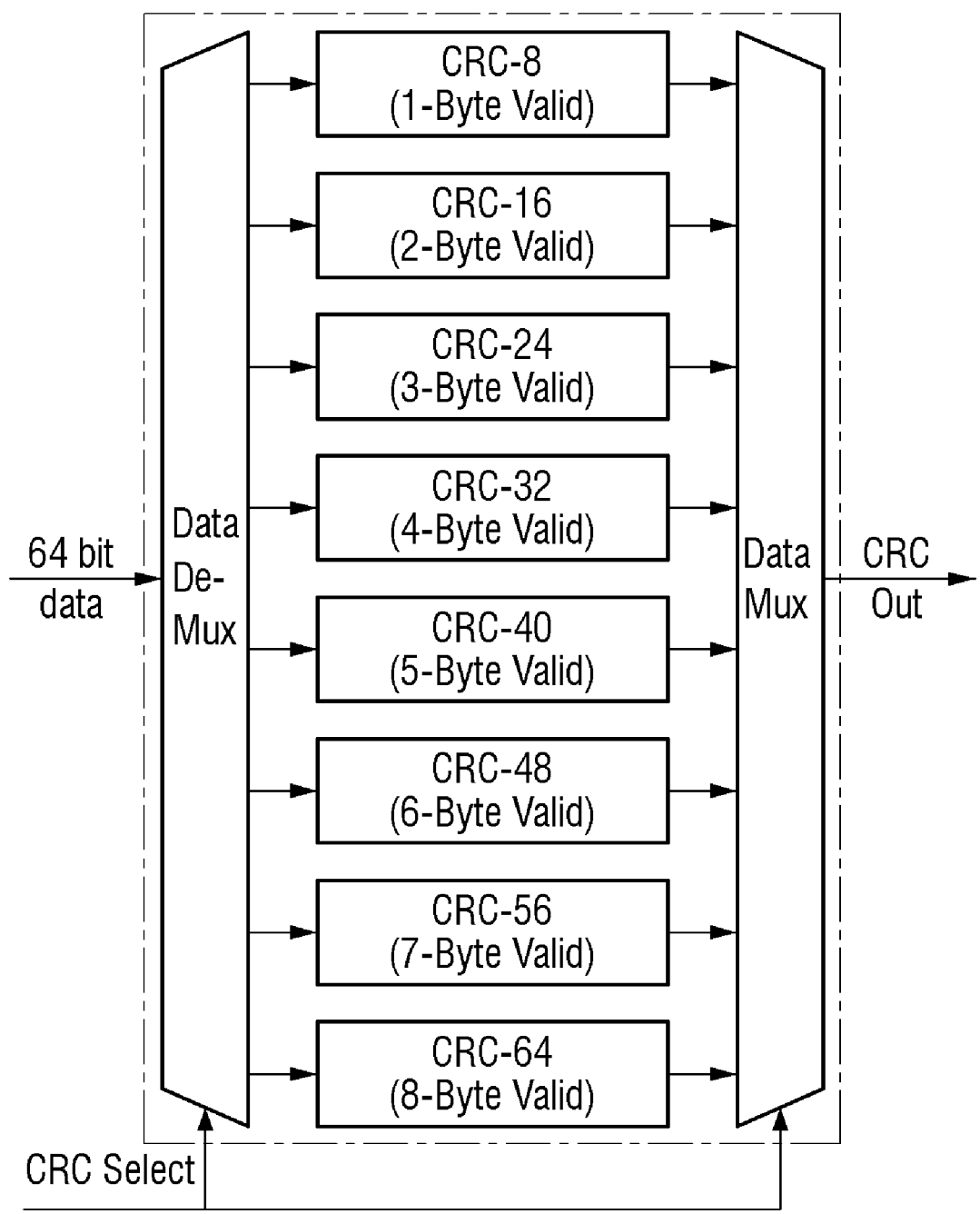
FIG. 2 is a schematic diagram illustrating a CRC engine system for 8 byte data, or 64 bit data, according to related art.
Figure 3:
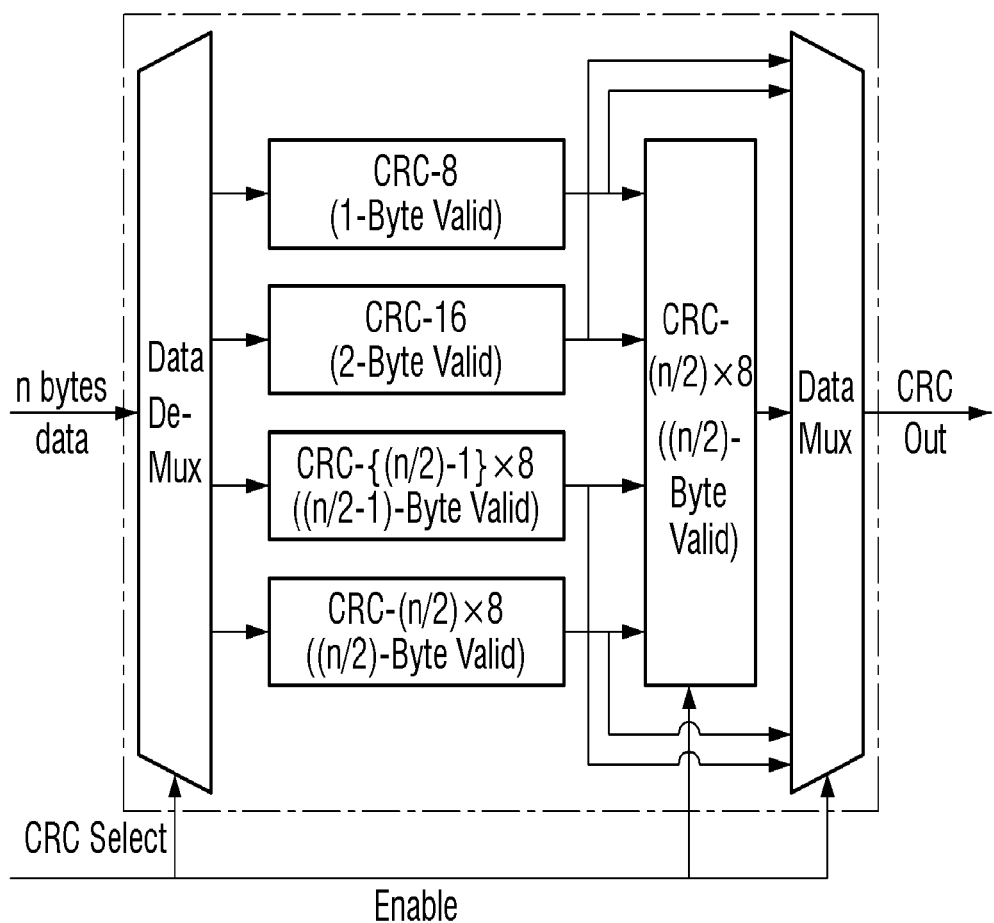
FIG. 3 is a schematic diagram illustrating a CRC engine system for n byte data, according to an embodiment of the disclosure.

FIG. 3 is a schematic diagram illustrating a cyclic redundancy check (CRC) engine system for detecting an error for n byte data, according to an embodiment of the disclosure. According to the disclosure, the number of CRC engines is reduced to calculate the final CRC whose number of valid bytes are less than the data width. The total number of CRC engines required to determine a final CRC for n byte data is only {(n/2)+1}, whereas in the related art as shown in FIG. 1, the number of CRC engines required is n CRC engines for n byte data. Implementing an optimized CRC engine system reduces the number of logic (NAND) cells, thus reducing the area utilization. The optimized CRC engine system increases performance and helps in power reduction.

The architecture of the disclosure comprises a data de-multiplexer, a plurality of CRC engines for 1 byte to n/2 byte, and a data multiplexer. The data de-multiplexer processes n bytes of input data. The plurality of CRC engines for 1 byte to n/2 byte are connected to the data de-multiplexer for processing de-multiplexed n byte data. The data multiplexer provides processed CRC output data. The plurality of CRC engines for 1 byte to n/2 byte are arranged in two columns. A first column comprises one or more CRC engines for 1 byte to n/2 byte and a second column comprises a CRC engine for n/2 byte. The CRC engine is enabled by providing a CRC select signal to the data de-multiplexer and the data multiplexer.

In another embodiment, the CRC engines for detecting an error for n byte data is reconstructed with a similar structure of a series of CRC engine by reducing the number of CRC engines in the first column and increasing CRC engines in the second column with the same final CRC output data.

In view of the architecture of the disclosure, the field-programmable gate array (FPGA) look-up table (LUT) and flip flop (FF) resource estimation for a CRC engine system is 40% less than an actual resource count as required for the CRC engine system disclosed in the related art (FIG. 1).

Figure 4:
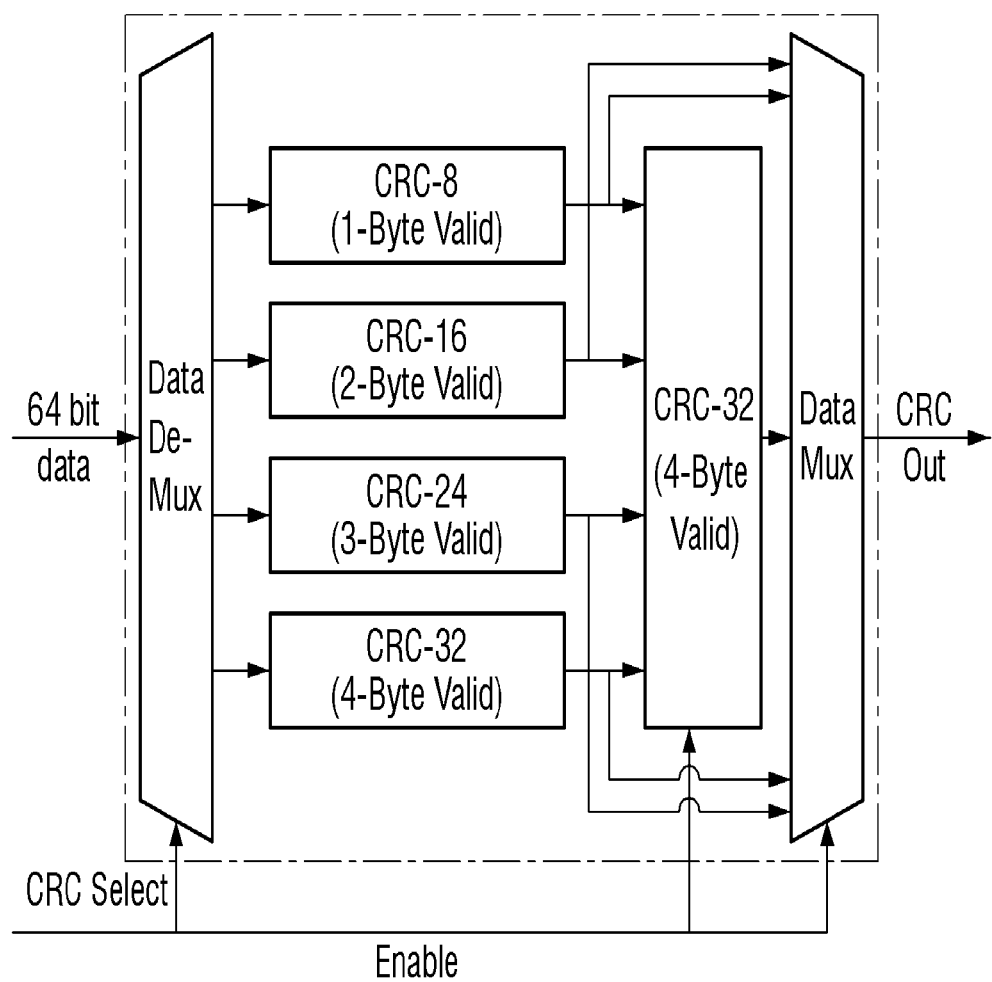
FIG. 4 is a schematic diagram illustrating a CRC engine system for 8 byte data, according to an embodiment of the disclosure.

FIG. 4 is a schematic diagram illustrating a cyclic redundancy check (CRC) engine system for detecting an error for 8 bytes, or 64 bit data, according to an embodiment of the disclosure. According to an exemplary embodiment of the disclosure, the CRC engine system is adapted to process 8 bytes of data (or 64 bits of data). In order to implement the CRC engine system according to the disclosure, the CRC engines are arranged in two columns between a data de-multiplexer and a data multiplexer. The first column includes a plurality of CRC engines for 1 byte to n/2 byte. Here 'n' byte is 8, so the plurality of CRC engines in the first column is configured to include 1 byte to 4 byte CRC engines. The first column includes a CRC-8 engine for 1 byte of data detection, a CRC-16 engine for 2 bytes of data detection, a CRC-24 engine for 3 bytes of data detection, and a first CRC-32 engine for 4 bytes of data detection. This means the first column is able to process the data up to 4 bytes (or 32 bits). The second column includes a second CRC-32 engine for 4 bytes of data detection. By arranging CRC engines in two columns, the disclosure processes the data up to 8 bytes (or 64 bits) and thereby overcomes the requirement of CRC engines for higher bytes such as a CRC-40 engine for 5 bytes, a CRC-48 for 6 bytes, a CRC-56 for 7 bytes, and a CRC-64 for 8 bytes. This arrangement of CRC engines in two columns reduces the requirement of area by almost half. The new architectural design improves timing optimization and reduces power consumption. Thus, the frequency of operation of the CRC engine system is twice that of CRC engine system as shown in FIG. 1. The CRC engine is enabled by providing a CRC select signal to the data de-multiplexer and the data multiplexer.

The data inputs from 1 byte to 4 bytes use corresponding CRC-8 to CRC-32 engines. For the data input of 5 bytes, a CRC could be calculated by combining the CRC-8 engine for 1 byte from the first column and the CRC-32 engine for 4 bytes from the second column. For the data input of 6 bytes, a CRC could be calculated by combining the CRC-16 engine for 2 bytes from the first column and the CRC-32 engine for 4 bytes from the second column. For the data input of 7 bytes, a CRC could be calculated by combining the CRC-24 engine for 3 bytes from the first column and the CRC-32 engine for 4 bytes from the second column. For the data input of 8 bytes, a CRC could be calculated by combining the first CRC-32 engine for 4 bytes from the first column and the second CRC-32 engine for 4 bytes from the second column. Due this arrangement, the silicon area gets optimized and achieves higher performance.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the disclosure may be practiced by those of ordinary skill in the art, without departing from the scope of the disclosure. Furthermore, those of ordinary skill in the art will appreciate that the foregoing description is by way of example only, and is not intended to limit the invention. Thus, it is intended that the present subject matter covers such modifications and variations.

We claim:

1. A data communication device comprising:
   a communication interface that exchanges a command and data based on a supported protocol;

a controller that communicates the data;
a memory circuit that stores the data; and
a cyclic redundancy check (CRC) engine system connected to the communication interface, the controller and the memory circuit, the CRC engine system comprising:
   a data de-multiplexer that receives multiplexed input data of n bytes or fewer and generates demultiplexed input data from the multiplexed input data, wherein n is an integer greater than 1,
   1 byte to n/2 byte CRC engines that are disposed in a first column and connected to the data de-multiplexer, wherein a selected one of the 1 byte to n/2 byte CRC engines processes between 1 byte and n/2 bytes of the demultiplexed input data to generate first CRC output data,
   an additional n/2 byte CRC engine that is disposed in a second column and connected to a data multiplexer and the 1 byte to n/2 byte CRC engines of the first column, wherein the additional n/2 CRC engine processes the first CRC output data and an additional n/2 bytes of the demultiplexed input data that is not processed by the selected one of the 1 byte to n/2 byte CRC engines to generate second CRC output data, and
   the data multiplexer that provides a processed CRC output data based on the first CRC output data and the second CRC output data.

2. The data communication device of claim 1, further comprising a field-programmable gate array (FPGA) connected to the CRC engine system.

3. The data communication device of claim 1, wherein the communication interface is a network communication interface.

4. The data communication device of claim 3, wherein the network communication interface is an Internet small computer systems interface (iSCSI).

5. The data communication device of claim 3, wherein the network communication interface is a transmission control protocol/Internet protocol (TCP/IP).

6. The data communication device of claim 1, wherein:
   the command is a small computer systems interface (SCSI) command, and
   the data is SCSI data.

7. The data communication device of claim 1, wherein the CRC engine system is a CRC on-chip or on-chip CRC engine system.

8. The data communication device of claim 1, wherein the CRC engine system is in the communication interface.

9. The data communication device of claim 1, wherein the CRC engine system is implemented for a serial communication protocol.

10. The data communication device of claim 9, wherein the serial communication protocol is a peripheral component interconnect express (PCIe).

11. The data communication device of claim 9, wherein the serial communication protocol is a universal serial bus (USB).

12. The data communication device of claim 9, wherein the serial communication protocol is a serial advanced technology attachment (SATA).

13. A method for data communicating by a data communication device, the method comprising:
   exchanging, by a communication interface, a command and data based on a supported protocol;
   controlling, by a controller, a data communication;
   storing, to a memory circuit, the communicated data;
   detecting, by a cyclic redundancy check (CRC) engine system connected to the communication interface, the controller and the memory circuit, an error in the communicated data;
   demultiplexing, by a data de-multiplexer, multiplexed input data of n bytes or fewer to generate demultiplexed input data, wherein n is an integer greater than 1;
   generating first CRC output data by processing between 1 byte and n/2 bytes of the demultiplexed input data using a selected one of 1 byte to n/2 byte CRC engines disposed in a first column to generate first CRC output data;
   generating second CRC output data by processing: (1) an additional n/2 bytes of the demultiplexed input data that is not processed by the selected one of the 1 byte to n/2 byte CRC engines using an additional n/2 byte CRC engine disposed in a second column and (2) the first CRC output data received from the selected one of the 1 byte to n/2 byte CRC engines disposed in the first column; and
   providing, by a data multiplexer, final CRC output data that is based on the first CRC output data and the second CRC output data.

14. The method of claim 13, further comprising receiving the communicated data, by a field-programmable gate array (FPGA) connected to the CRC engine system.

15. The method of claim 13, wherein the communication interface is a network communication interface.

16. The method of claim 13, wherein:
   the command is a small computer systems interface (SCSI) command, and
   the data is SCSI data.

17. The method of claim 13, wherein the CRC engine system is a CRC on-chip or on-chip CRC engine system.

18. The method of claim 13, wherein the CRC engine system is in the communication interface.

19. The method of claim 13, wherein the CRC engine system is implemented for a serial communication protocol.

20. The method of claim 19, wherein the serial communication protocol is at least of a peripheral component interconnect express (PCIe), universal serial bus (USB), or serial advanced technology attachment (SATA).

* * * * *